United States Patent [19]

Anttila et al.

[11] Patent Number: 5,078,848
[45] Date of Patent: Jan. 7, 1992

[54] PROCEDURE AND APPARATUS FOR THE COATING OF MATERIALS BY MEANS OF A PULSATING PLASMA BEAM

[76] Inventors: Asko Anttila, Mustikkasuontie 17, 00940 Helsinki; Juha-Pekka Hirvonen, Vanamonkuja 1 A 6, 01350 Vantaa, both of Finland; Jari Koskinen, 546 Warren Rd., Apt. 2, Ithaca, N.Y. 14850

[21] Appl. No.: 543,741
[22] PCT Filed: Jan. 18, 1989
[86] PCT No.: PCT/FI89/00008
 § 371 Date: Sep. 18, 1990
 § 102(e) Date: Sep. 18, 1990
[87] PCT Pub. No.: WO89/06708
 PCT Pub. Date: Jul. 27, 1989

[30] Foreign Application Priority Data
Jan. 18, 1988 [FI] Finland ...................... 880203

[51] Int. Cl.⁵ ............................ C23C 14/32
[52] U.S. Cl. ................... 204/192.38; 204/298.41; 427/37
[58] Field of Search ......... 204/192.38, 298.41; 427/37; 219/76.13, 76.14, 76.16, 130.51

[56] References Cited

U.S. PATENT DOCUMENTS

| | | | |
|---|---|---|---|
| 4,490,229 | 12/1984 | Mirtich et al. | 204/192.11 |
| 4,565,618 | 1/1986 | Banks | 204/298.41 |
| 4,645,895 | 2/1987 | Boxman et al. | 219/76.13 |
| 4,929,321 | 5/1990 | Buhl | 204/192.38 |

FOREIGN PATENT DOCUMENTS

| | | |
|---|---|---|
| 225680 | 6/1987 | European Pat. Off. |
| 430293 | 11/1983 | Sweden |
| 450539 | 6/1987 | Sweden |

OTHER PUBLICATIONS

"Pulsed Metallic-Plasma Generators", by Gilmour, Jr., et al, *Proceedings of the IEEE*, vol. 60, No. 8, Aug. 1972, pp. 977-992.

*Primary Examiner*—Aaron Weisstuch
*Attorney, Agent, or Firm*—Armstrong, Nikaido, Marmelstein, Kubovcik & Murray

[57] ABSTRACT

Procedure and apparatus for the coating of materials. In the procedure the material or substrate (7) is coated by means of a pulsating plasma beam emitted from at least one electrode (1). The plasma beam is accelerated by a magnetic field and deflected by the same to separate the uncharged particles from it, whereupon the plasma beam hits the surface of the material (7) to be coated. The apparatus of the invention for the coating of materials is provided with electrodes (1, 3), at least one voltage source (2) and at least one capacitor (C1) for producing a pulsating plasma beam and at least one deflected coil (4) which generates a magnetic field that accelerates the plasma beam emitted by at least one electrode (1) and deflects the beam to separate the uncharged particles from it.

7 Claims, 1 Drawing Sheet

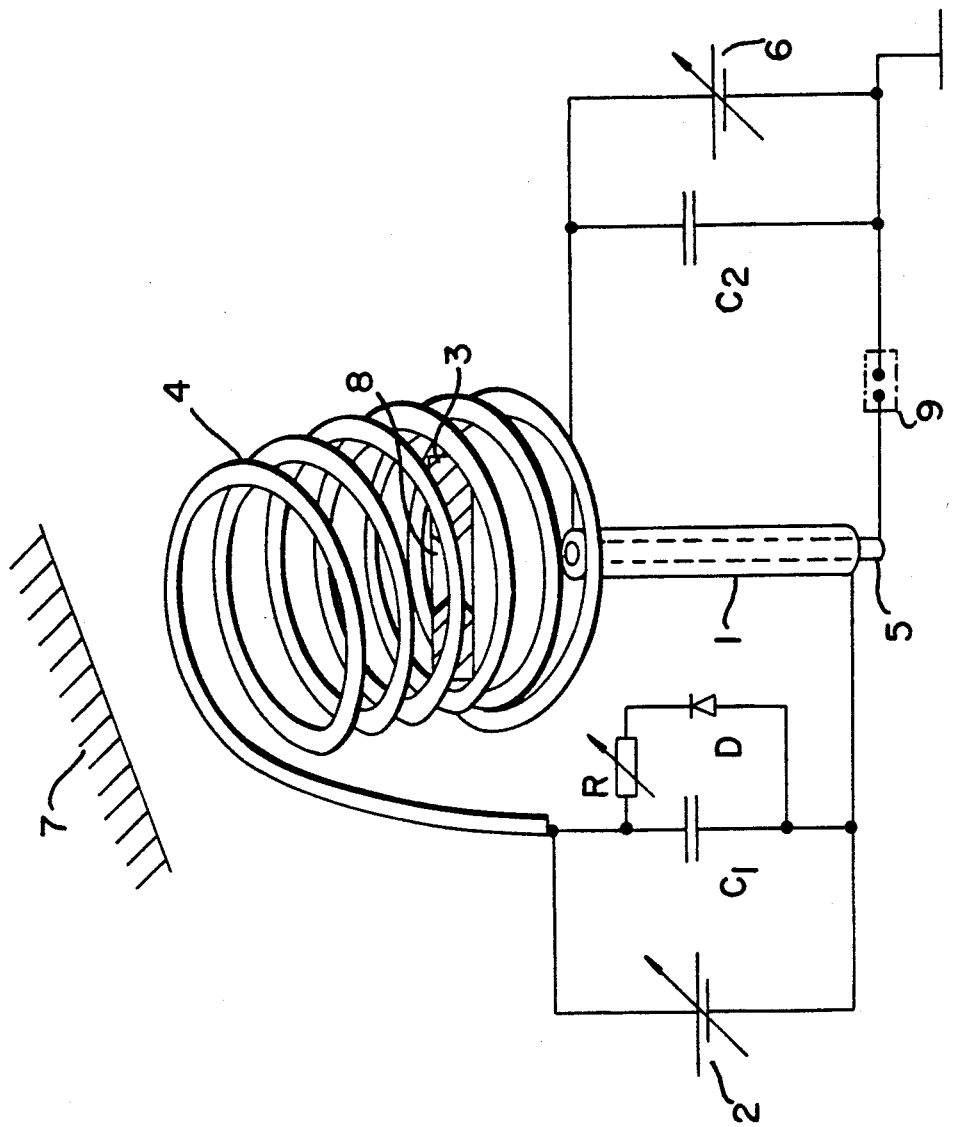

PROCEDURE AND APPARATUS FOR THE COATING OF MATERIALS BY MEANS OF A PULSATING PLASMA BEAM

FIELD OF THE INVENTION

The present invention relates to a procedure and an apparatus for the coating of materials.

BACKGROUND OF THE INVENTION

Coatings consisting of or resembling a diamond material have properties similar to corresponding traditional diamonds. The first property is hardness. Another significant mechanical property is a low friction coefficient. The resistance to wear is also extraordinary. Furthermore, such a coating remains unchanged in all known kinds of acids and bases. Diamond and diamond-like materials are therefore especially suited for the coating of objects subject to wear or corrosion, e.g. bearings without lubrication. A further notable factor is the high refraction index of diamonds.

In microelectronics, the high thermal capacity and thermal conductivity of diamond and diamond-like coatings provide significant advantages. To achieve higher component densities and speeds, it is necessary to reduce the structural size of integrated circuits. This makes it more difficult to remove the heat generated by the electric current, and it also means that good conductivity is more important than before.

In current practice, diamond-like coatings are produced by direct ion beam treatment, which is based on increasing the energy of ions. In direct ion beam coating, the coat is grown on the surface of the object material directly from the ion beam, from which the impurities have been removed by means of a separating magnet. The worst problem with this method is the difficulty of constructing an ion source of sufficient capacity. Another currently used method for growing a diamond coat is based on plasma-assisted vapor phase coat deposition (PAVCD). In this method, a crystal-line diamond is grown from a mixture of methane and hydrogen. Unlike the method based on the use of an energetic ion beam for growing a diamond coat, which can be implemented in room temperature, the PAVCD method requires a high temperature of the order of 800° C. This is a serious disadvantage in view of the coating of conventional materials used in tools or construction.

SUMMARY OF THE INVENTION

The object of the present invention is to eliminate the drawbacks referred to above. The procedure of the invention for the coating of materials is characterized in that the material is coated using a pulsating plasma beam obtained from at least one electrode. The plasma beam is accelerated by a magnetic field and deflected by same to separate the uncharged particles from it, whereupon the plasma beam hits the surface of the material to be coated.

The advantages of the procedure are that it is simple and enables even large surfaces to be coated.

A preferred embodiment of the procedure of the invention is characterized in that the plasma beam consists of particles emitted from at least one electrode.

Another preferred embodiment of the procedure of the invention is characterized in that the coating is performed in a vacuum.

Another preferred embodiment of the procedure of the invention is characterized in that the coating process uses a gaseous medium which reacts with charged particles.

Another preferred embodiment of the procedure of the invention is characterized in that the plasma beam is deflected by a magnetic field produced by means of a deflected coil.

The apparatus designed for implementing the procedure of the invention for the coating of materials is characterized in that, for the coating of a material, the apparatus is provided with electrodes, at least one voltage source and at least one capacitor for producing a pulsating plasma beam and at least one deflected coil which generates a magnetic field that accelerates the plasma beam emitted by at least one electrode and deflects the beam to separate uncharged particles from it.

A preferred embodiment of the apparatus designed for implementing the procedure of the invention is characterized in that, to prevent oscillation of the voltage, the apparatus is provided with a diode connected in parallel with the capacitor.

Another preferred embodiment of the apparatus designed for implementing the procedure of the invention is characterized in that it is provided with at least one igniter circuit to produce an arc between the electrodes.

Another preferred embodiment of the apparatus designed for implementing the procedure of the invention is characterized in that at least one of the electrodes is of a cylindrical form.

Another preferred embodiment of the apparatus designed for implementing the procedure of the invention is characterized in that at least one of the electrodes is placed wholly or partially inside the coil.

Another preferred embodiment of the apparatus designed for implementing the procedure of the invention is characterized in that at least one of the electrodes is provided with at least one hole through which the plasma beam is directed.

Another preferred embodiment of the apparatus designed for implementing the procedure of the invention is characterized in that the igniter circuit comprises a metal rod inside each cylindrical electrode, another capacitor and a voltage source, which are used to produce an igniting arc between the electrode and the rod.

Another preferred embodiment of the apparatus designed for implementing the procedure of the invention is characterized in that the igniter circuit has at least one external spark gap or switch.

DESCRIPTION OF THE DRAWING

In the following, the invention is described by the aid of an example with reference to the attached drawing, which represents a plasma accelerator and an object to be coated.

DESCRIPTION OF THE PREFERRED EMBODIMENT

For the coating of a material, the plasma accelerator produces a cloud of plasma from carbon. This cloud is accelerated towards the object to be coated, and deflected by the magnetic field, whereupon the plasma beam strikes the surface of the object. Both the plasma accelerator and the object to be coated are placed in a vacuum. The plasma accelerator has a cylindrical cathode 1 made of solid carbon, which is connected to the negative terminal of the first voltage source 2 and to the first terminal of the first capacitor C1. The disc-shaped anode 3, which has a hole 8 in the middle, is connected to a cylindrical coil 4 formed from a copper conductor. The coil is deflected and connected at one end to the positive terminal of the first voltage source 2 and to the other terminal of the first capacitor C1. Connected to the terminals of the capacitor C1 are also a diode D and a variable resistor R. The cathode 1 is partially inside the coil 4 and the anode 3 is wholly inside the coil 4.

Inside the cathode 1 is a metal rod 5. The cathode 1 and the rod 5 together with a second voltage source 6 and a second capacitor C2, from an igniter circuit. The second voltage source 6 is variable. The cathode 1 is connected to the positive terminal of the second voltage source 6 and to the first terminal of the second capacitor C2. The metal rod 5 is connected to the negative terminal of the second voltage source 6 and to the other terminal of the second capacitor C2.

The plasma accelerator performs the coating of a metal plate 7 as follows. The first voltage source 2 charges the first capacitor C1, connected in parallel with the voltage source 2. The second voltage source 6 charges the second capacitor C2, likewise connected in parallel with it, until a spark-over occurs across the air gap between the cathode 1 and the metal rod 5, so that an arc is generated in the air gap. This arc discharges the second capacitor C2 and correspondingly produces an arc between the cathode 1 and the anode 3. As a result, the cathode begins to emit a beam of carbon particles consisting of charged ions and uncharged atoms. The arc between the cathode 1 and the anode 3 discharges the first capacitor C1, and the arc is extinguished when the capacitor voltage falls below the level required for maintaining the arc. In this manner, a pulsating plasma beam is produced from carbon ions and carbon atoms. The duration of a pulse is determined by the capacitance of the first capacitor C1.

Connected in parallel with the first capacitor C1 are a diode D, whose function is to remove the reverse voltage produced across the first capacitor C1 by the oscillating circuit consisting of capacitor C1 and coil 4, and a variable resistor R proctecting the diode D.

The plasma beam is accelerated through the magnetic field generated by the coil 4. Since the coil 4 has a curved shape in its lengthwise direction, the charged ions passing through the hole 8 in the anode 3 will follow the curvature of the magnetic field, whereas uncharged particles will proceed straight past the plate 7. In this manner, uncharged particles are separated from the charged ions. The plate 7 to be coated is placed close to that end of the coil 4 which is connected to the first voltage source 2 and the first capacitor C1. Since the magnetic field generated by the coil 4 diverts the charged ions but does not affect the passage of uncharged particles, the plate to be coated is only struck by ions accelerated by the magnetic field.

When an ion with sufficient energy, imparted by the magnetic field, hits the surface of the plate 7, it is able to penetrate into the surface material. In the course of the next 10-11 seconds, the microscopic area around the penetrating ion undergoes remarkable changes. A significant proportion of the atoms in the plate surface have been displaced from their normal lattice positions, and the proportion of vacancies and intersitial atoms may reach a level of several per cent. The conditions inside a cascade like this correspond to a temperature of several thousand °C., although the ambient temperature remains unchanged. Moreover, the pressure at the edges of the cascade increases. As a result of the process described, a diamond-like coat is produced on the surface of the plate 7.

Instead of a vacuum, it is also possible to use a gaseous medium which reacts with the ions in the surface of the material to be coated, producing e.g. a coat of boron nitride. In the igniter circuit, the arc between the cathode 1 and the metal rod 5 is automatically extinguished when the voltage across the second capacitor C2 falls below the level required for maintaining the arc. The igniter circuit may also employ an external spark gap 9 or switch to extinguish the arc between the cathode 1 and the metal rod 5 at a desired moment.

It is obvious to a person skilled in the art that different embodiments of the invention are not restricted to the examples described above, but that they may instead be varied within the scope of the following claims.

We claim:

1. A method for coating of a substrate by using a plasma beam formed by an electric arc passing between a coating material source electrode and another electrode, the method comprising the steps of:

generating a pulsating plasma beam of charged ions and uncharged particles from said coating material source electrode;

providing a magnetic coil of curved shape in its lengthwise direction, said curved magnetic coil generating a magnetic field for guiding said plasma beam in a curved magnetic path; and positioning a substrate at one end of said curved magnetic coil in a location such that said charged ions, which are guided along the interior of said curved magnetic coil, impinge on and coat said substrate and said uncharged particles, which are not guided along the interior of said curved magnetic coil, are removed from said plasma beam and do not coat said substrate.

2. A method according to claim 1, wherein the magnetic field in said curved magnetic path is pulsating.

3. An apparatus for coating of substrates by using a plasma beam, the apparatus comprising:

a coating material source electrode and another electrode, a voltage source and a capacitor for generating a pulsating plasma beam of charged ions and uncharged particles from said coating material source electrode; and a magnetic coil of curved shape in its lengthwise direction for providing a curved magnetic path for guiding said plasma beam in said curved magnetic path, and means for positioning a substrate at a location at one end of said coil in a manner such that said charged ions, which are guided along the interior of said curved coil, impinge on and coat said substrate and said uncharged particles, which are not guided along the interior of said curved coil, are removed from said plasma beam and do not coat said substrate.

4. An apparatus according to claim 3, wherein at least one of the electrodes is of a cylindrical form.

5. An apparatus according to claim 3, wherein at least one of the electrodes is placed wholly or partially inside the curved coil.

6. An apparatus according to claim 3, further comprising an igniter circuit to produce an igniting arc between said electrodes, said igniter circuit including a conducting rod positioned inside said coating material source electrode which is of a cylindrical form, another capacitor and a voltage source.

7. An apparatus according to claim 6, wherein the igniter circuit is provided with at least one external spark gap or switch.

* * * * *